US012768902B2

(12) United States Patent
Miller

(10) Patent No.: US 12,768,902 B2
(45) Date of Patent: Oct. 20, 2026

(54) SYSTEM AND DEVICE FOR PORTABLE ELECTRICAL TESTING AND CONTROL

(71) Applicant: RAM Built, LLC, Chippewa Falls, WI (US)

(72) Inventor: Robert A. Miller, Chippewa Falls, WI (US)

(73) Assignee: RAM Built, LLC, Chippewa Falls, WI (US)

( * ) Notice: Subject to any disclaimer, the term of this patent is extended or adjusted under 35 U.S.C. 154(b) by 0 days.

(21) Appl. No.: 19/102,891

(22) PCT Filed: Aug. 15, 2023

(86) PCT No.: PCT/US2023/072234
§ 371 (c)(1),
(2) Date: Feb. 11, 2025

(87) PCT Pub. No.: WO2024/040069
PCT Pub. Date: Feb. 22, 2024

(65) Prior Publication Data

US 2026/0043872 A1 Feb. 12, 2026

Related U.S. Application Data

(60) Provisional application No. 63/398,405, filed on Aug. 16, 2022.

(51) Int. Cl.
*G01R 31/44* (2020.01)
*G01R 1/20* (2006.01)
(Continued)

(52) U.S. Cl.
CPC ............... *G01R 31/44* (2013.01); *G01R 1/20* (2013.01)

(58) Field of Classification Search
CPC ................................. G01R 31/44; G01R 1/20
See application file for complete search history.

(56) References Cited

U.S. PATENT DOCUMENTS 4,884,032 A 11/1989 LaPensee
8,947,096 B1 2/2015 Wolf
(Continued)

FOREIGN PATENT DOCUMENTS

KR 10-2014-0137294 A 12/2014

OTHER PUBLICATIONS

International Search Report & Written Opinion for International Application No. PCT/US2023/072234, mailed Dec. 4, 2023, 9 pages.

(Continued)

*Primary Examiner* — Elim Ortiz
(74) *Attorney, Agent, or Firm* — Casimir Jones, S.C.; Brian F. Bradley

(57) ABSTRACT

A system comprising a device including a battery pack interface, an outlet connector with a ground line, a first output line, and a second output line, a plurality of switches, and a controller with a wireless communication module. The system further includes a battery pack removably coupled to the battery pack interface, and a user device in wireless communication with the wireless communication module. The first output line and the second output line are individually energized in response to user input on either one of the plurality of switches or on the user device.

20 Claims, 5 Drawing Sheets

(51) Int. Cl.
*G01R 17/02* (2006.01)
*G01R 31/00* (2006.01)

(56) References Cited

U.S. PATENT DOCUMENTS

| | | | | |
|---|---|---|---|---|
| 10,663,508 | B1 * | 5/2020 | Walker | G01R 31/44 |
| 2017/0285084 | A1 * | 10/2017 | Johnson | G01R 31/007 |
| 2017/0297447 | A1 | 10/2017 | Tzivanopoulos et al. | |
| 2019/0187211 | A1 | 6/2019 | Muller et al. | |

OTHER PUBLICATIONS

Innovative Products of America Incorporated, "Light/Heavy Ranger MUTT (Mobile Universal Trailer Tester) Operator's Manual", 2022, 12 pages.
Innovative Products of America Incorporated, "Light Ranger MUTT (Mobile Universal Trailer Tester)", 2020, 1 pages.
For Sale By Inventor, "Light Check Trailer Light Test", Nov. 24, 2014, https://forsalebyinventor.com/products/light- check-trailer-light-test, 7 pages.

* cited by examiner

SYSTEM AND DEVICE FOR PORTABLE ELECTRICAL TESTING AND CONTROL

CROSS-REFERENCE TO RELATED APPLICATIONS

This application claims priority to and the benefit of U.S. Provisional Patent Application No. 63/398,405, filed Aug. 16, 2022 and is incorporated herein by reference in their entirety for all purposes.

TECHNICAL FIELD

The present disclosure relates devices for testing and controlling lights on a powered object (e.g., a trailer).

BACKGROUND

Functioning trailer lights are required by law and are helpful in preventing safety issues. However, trailer lights are difficult to test. Under normal conditions, the trailer must be connected to a host vehicle to power the lights. Additionally, two people are often required to test a trailer's lights. One person must sit within the host vehicle and operate each signal—tail marker, brakes, electric brakes (in the case of semi-trailers), back-up, auxiliary power, left turn, and right turn—while a second person must stand behind the trailer to ensure the trailer's lights function with the appropriate signal. Some testing scenarios require the simultaneous powering of multiple lights, such as operating a turn signal while applying the brakes.

In addition to standard repair shop applications, trailer lights are tested in a variety of settings. For example, quality engineers working in distribution centers must ensure trailers scheduled for dispatch are functional prior to their departure. Connecting a trailer to a host vehicle and using two engineers to test one trailer can take multiple minutes. Law enforcement officers also verify functioning trailer lights during traffic stops and trailer checks, and connecting to a different host vehicle and calling a second officer to verify the functioning of the lights can take large amounts of time.

SUMMARY

The disclosure provides, in one aspect, a device comprising: a housing; a first switch positioned on the housing; a second switch positioned on the housing; a battery pack interface positioned on the housing; and an outlet connector positioned on the housing. The outlet connector includes a ground line, a first output line, and a second output line. The device further includes a flash circuit with a timer and an optocoupler electrically coupled to the ground line. The device further includes a mode switch that selectively places the device in a steady mode or a flash mode; a controller including a wireless communication module configured to receive a wireless signal; a first relay electrically coupled to the first output line and the controller; and a second relay electrically coupled to the second output line and the controller. The first output line is selectively energized in response to actuation of the first switch or in response to receiving the wireless signal; and the second output line is selectively energized in response to actuation of the second switch or in response to receiving the wireless signal.

In some embodiments, the first output line is selectively energized by closing the first relay, and wherein closing the first relay is in response to actuation of the first switch or in response to receiving the wireless signal; and wherein the second output line is selectively energized by closing the second relay, and wherein closing the second relay is in response to actuation of the second switch or in response to receiving the wireless signal.

In some embodiments, the device further includes a power switch positioned on the housing and electrically coupled to the controller.

In some embodiments, the mode switch is positioned on the housing.

In some embodiments, the mode switch includes a mode relay electrically coupled to the ground line and the controller.

In some embodiments, the mode switch selectively places the device in the steady mode by closing the mode relay.

In some embodiments, closing the mode relay is in response to actuation of the mode switch or in response to receiving the wireless signal.

In some embodiments, the flash circuit operates at a frequency.

In some embodiments, the frequency is adjustable by a user.

In some embodiments, the device further includes a resettable circuit breaker.

In some embodiments, the device further includes a current sensor.

In some embodiments, the housing includes a first surface, and wherein the battery pack interface, the mode switch, the first switch, and the second switch are positioned on the first surface; and wherein the housing includes a second surface, and wherein the outlet connector is positioned on the second surface.

In some embodiments, the device is hand-held.

The disclosure provides, in one aspect, a system comprising a device including a battery pack interface, an outlet connector with a ground line, a first output line, and a second output line, a plurality of switches, and a controller with a wireless communication module. The system further includes a battery pack removably coupled to the battery pack interface; and a user device in wireless communication with the wireless communication module. The first output line and the second output line are individually energized in response to user input on either one of the plurality of switches or on the user device.

In some embodiments, the system further includes a case with a handle; and wherein the device and the battery pack are positioned within the case.

In some embodiments, the user device is a remote control, a cell phone, a tablet, or a computer.

In some embodiments, the system further includes a powered object with a first light and a second light, wherein the first light is electrically coupled to the first output line and the ground line, and wherein the second light is electrically coupled to the second output line and the ground line.

In some embodiments, the powered object is a trailer, a light assembly, a hazard marker, a lighted sign, a mechanical sign, or accessory.

In some embodiments, the device further includes a flash circuit including a timer and an optocoupler electrically coupled to the ground line.

In some embodiments, the user device wirelessly sends an automated sequence of wireless signals to the wireless communication module in response to user input on the user device.

Other aspects of the disclosure will become apparent by consideration of the detailed description and accompanying drawings.

Definitions

As used herein, the terms "processor" and "central processing unit" or "CPU" are used interchangeably and refer to a device that is able to read a program from a computer memory (e.g., ROM or other computer memory) and perform a set of steps according to the program. As used herein, the term "processor" (e.g., a microprocessor, a microcontroller, a processing unit, or other suitable programmable device) can include, among other things, a control unit, an arithmetic logic unit ("ALC"), and a plurality of registers, and can be implemented using a known computer architecture (e.g., a modified Harvard architecture, a von Neumann architecture, etc.). In some embodiments the processor is a microprocessor that can be configured to communicate in a stand-alone and/or a distributed environment, and can be configured to communicate via wired or wireless communications with other processors, where such one or more processor can be configured to operate on one or more processor-controlled devices that can be similar or different devices.

As used herein, the term "memory" is any memory storage and is a non-transitory computer readable medium. The memory can include, for example, a program storage area and the data storage area. The program storage area and the data storage area can include combinations of different types of memory, such as a ROM, a RAM (e.g., DRAM, SDRAM, etc.), EEPROM, flash memory, a hard disk, a SD card, or other suitable magnetic, optical, physical, or electronic memory devices. The processor can be connected to the memory and execute software instructions that are capable of being stored in a RAM of the memory (e.g., during execution), a ROM of the memory (e.g., on a generally permanent bases), or another non-transitory computer readable medium such as another memory or a disc. In some embodiments, the memory includes one or more processor-readable and accessible memory elements and/or components that can be internal to the processor-controlled device, external to the processor-controlled device, and can be accessed via a wired or wireless network. Software included in the implementation of the methods disclosed herein can be stored in the memory. The software includes, for example, firmware, one or more applications, program data, filters, rules, one or more program modules, and other executable instructions. For example, the processor can be configured to retrieve from the memory and execute, among other things, instructions related to the processes and methods described herein.

As used herein, the term "computer readable medium" refers to any device or system for storing and providing information (e.g., data and instructions) to a computer processor.

Examples of computer readable media include, but are not limited to, DVDs, CDs, hard disk drives, magnetic tape and servers for streaming media over networks, whether local or distant (e.g., cloud-based).

"About" and "approximately" are used to provide flexibility to a numerical range endpoint by providing that a given value may be "slightly above" or "slightly below" the endpoint without affecting the desired result.

The term "coupled," as used herein, is defined as "connected," although not necessarily directly, and not necessarily mechanically. The term coupled is to be understood to mean physically, magnetically, chemically, fluidly, electrically, or otherwise coupled, connected or linked and does not exclude the presence of intermediate elements between the coupled elements absent specific contrary language.

As used herein, the term "in electronic communication" refers to electrical devices (e.g., computers, processors, etc.) that are configured to communicate with one another through direct or indirect signaling. Likewise, a computer configured to transmit (e.g., through cables, wires, infrared signals, telephone lines, airwaves, etc.) information to another computer or device, is in electronic communication with the other computer or device.

As used herein, the term "transmitting" refers to the movement of information (e.g., data) from one location to another (e.g., from one device to another) using any suitable means.

As used herein, the term "network" generally refers to any suitable electronic network including, but not limited to, a wide area network ("WAN") (e.g., a TCP/IP based network), a local area network ("LAN"), a neighborhood area network ("NAN"), a home area network ("HAN"), or personal area network ("PAN") employing any of a variety of communications protocols, such as Wi-Fi, Bluetooth, ZigBee, etc. In some embodiments, the network is a cellular network, such as, for example, a Global System for Mobile Communications ("GSM") network, a General Packet Radio Service ("GPRS") network, an Evolution-Data Optimized ("EV-DO") network, an Enhanced Data Rates for GSM Evolution ("EDGE") network, a 3GSM network, a 4GSM network, a 5G New Radio, a Digital Enhanced Cordless Telecommunications ("DECT") network, a digital AMPS ("IS-136/TDMA") network, or an Integrated Digital Enhanced Network ("iDEN") network, etc.

As used herein, the term "portable" refers to the ability for the device to be transported by a person (e.g., by hand).

The terms "comprise(s)," "include(s)," "having," "has," "can," "contain(s)," and variants thereof, as used herein, are intended to be open-ended transitional phrases, terms, or words that do not preclude the possibility of additional acts or structures. The singular forms "a," "an" and "the" include plural references unless the context clearly dictates otherwise. The present disclosure also contemplates other embodiments "comprising," "consisting of" and "consisting essentially of," the embodiments or elements presented herein, whether explicitly set forth or not.

For the recitation of numeric ranges herein, each intervening number there between with the same degree of precision is explicitly contemplated. For example, for the range of 6-9, the numbers 7 and 8 are contemplated in addition to 6 and 9, and for the range 6.0-7.0, the number 6.0, 6.1, 6.2, 6.3, 6.4, 6.5, 6.6, 6.7, 6.8, 6.9, and 7.0 are explicitly contemplated.

In the foregoing description of preferred embodiments, specific terminology has been resorted to for the sake of clarity. However, the invention is not intended to be limited to the specific terms so selected, and it is to be understood that each specific term includes all technical equivalents which operate in a similar manner to accomplish a similar technical purpose. Terms such as "top" and "bottom", "front" and "rear", "inner" and "outer", "above", "below", "upper", "lower", "vertical", "horizontal", "upright" and the like are used as words of convenience to provide reference points.

Before any embodiments are explained in detail, it is to be understood that the invention is not limited in its application to the details of construction and the arrangement of components set forth in the following description or illustrated in the following drawings. The invention is capable of other embodiments and of being practiced or of being carried out in various ways.

DETAILED DESCRIPTION

Unless otherwise defined, all technical and scientific terms used herein have the same meaning as commonly understood by one of ordinary skill in the art. In case of conflict, the present document, including definitions, will control. Preferred methods and materials are described below, although methods and materials similar or equivalent to those described herein can be used in practice or testing of the present disclosure. All publications, patent applications, patents and other references mentioned herein are incorporated by reference in their entirety. The materials, methods, and examples disclosed herein are illustrative only and not intended to be limiting.

Provided herein is a compact, self-contained, trailer light testing device and system capable of being operated by a single user and independently powering and controlling every signal light on all pull-type trailer lights (including semi-trailers) in an off mode, a steady on mode, and a flashing mode. The device is designed to troubleshoot, diagnose, and isolate specific problems with trailer lights, for example, when a host vehicle is not present. The device and system are also designed to be used as a portable self-contained host light controller and power source to operate flashing lights and other electrical components (e.g., horn, motors, etc.) for safety or general display applications.

Figure 1:
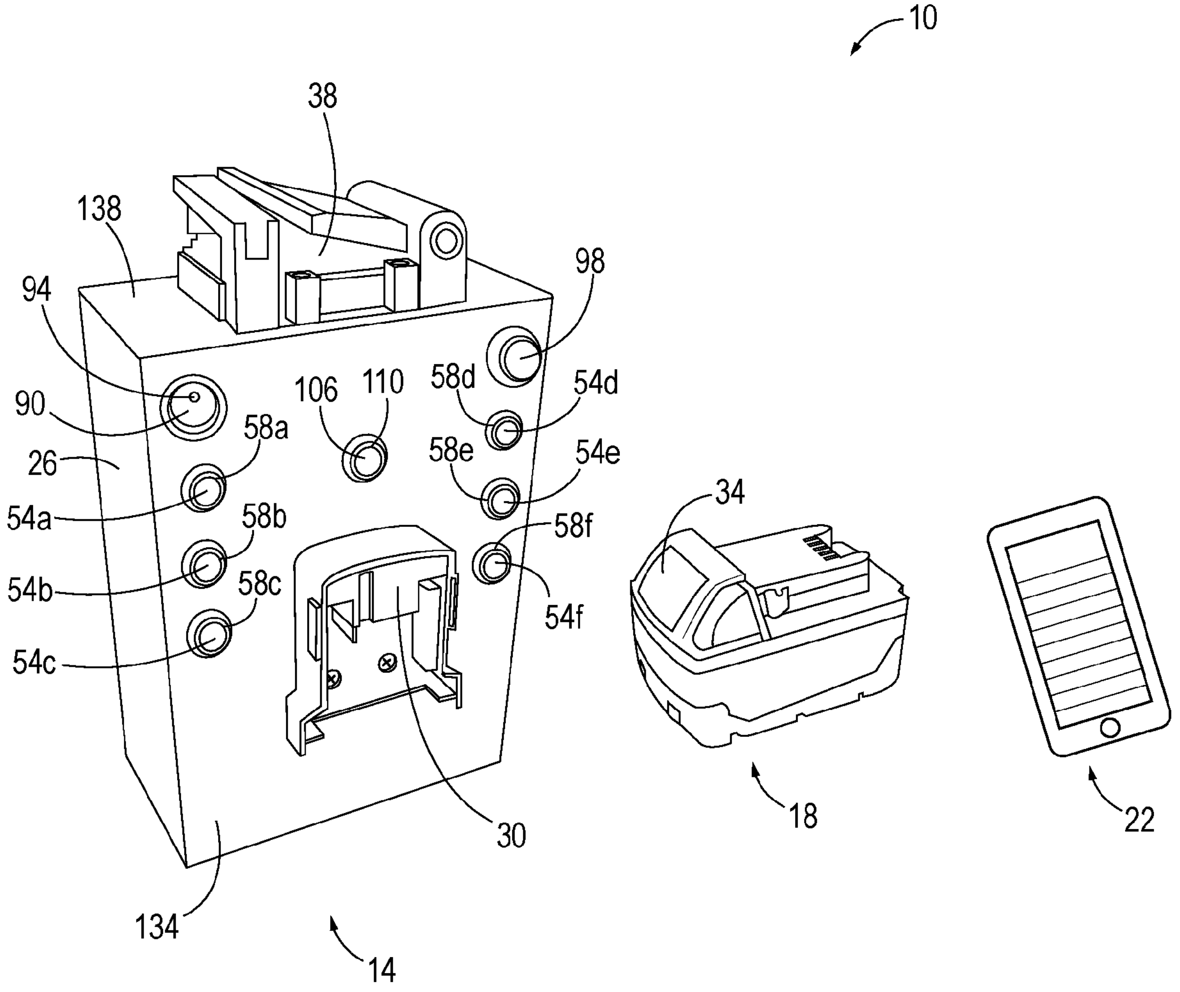
FIG. 1 is a perspective view of a system including a device, a battery pack, and a user device.

With reference to FIG. 1, a light control system 10 includes a device 14 (e.g., a light tester, a light controller), a battery pack 18, and a user device 22. The device 14 includes a housing 26 and a battery pack interface 30 positioned on the housing 26. The battery pack 18 is removably coupled to the battery pack interface 30. In some embodiments, the battery pack 18 includes a battery health indicator 34. In some embodiments, the battery pack 18 is rechargeable. In some embodiments, the battery pack 18 is rechargeable with a solar panel. Advantageously, the battery pack 18 can be provided from various battery vendors. In some embodiments, the device 14 includes a voltage regulator to adjust the battery pack voltage. For example, the voltage regulator modifies various amperage and voltage from rechargeable power packs used to power cordless power tools to ensure a consistent supply voltage (e.g., 12 volts, 18 volts, 21 volts, etc.) is supplied to the other device components. The ability to utilize removable battery packs allows for quick battery replacement and reduces any downtime for the device.

Figure 3A:
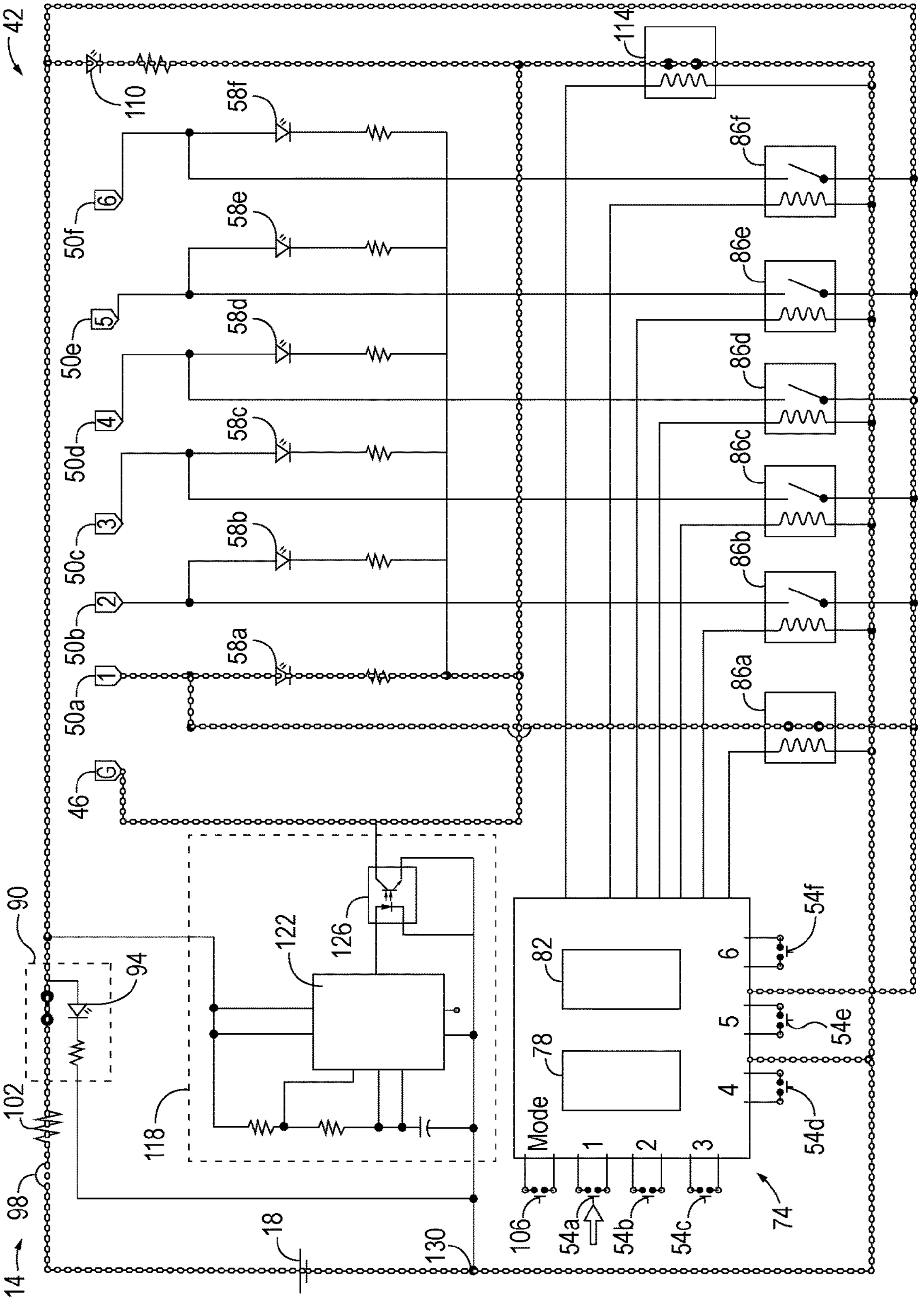
FIG. 3A is a circuit diagram of the light tester device of FIG. 1, shown in a steady mode with an output line (e.g., output line 1) energized.
Figure 3B:
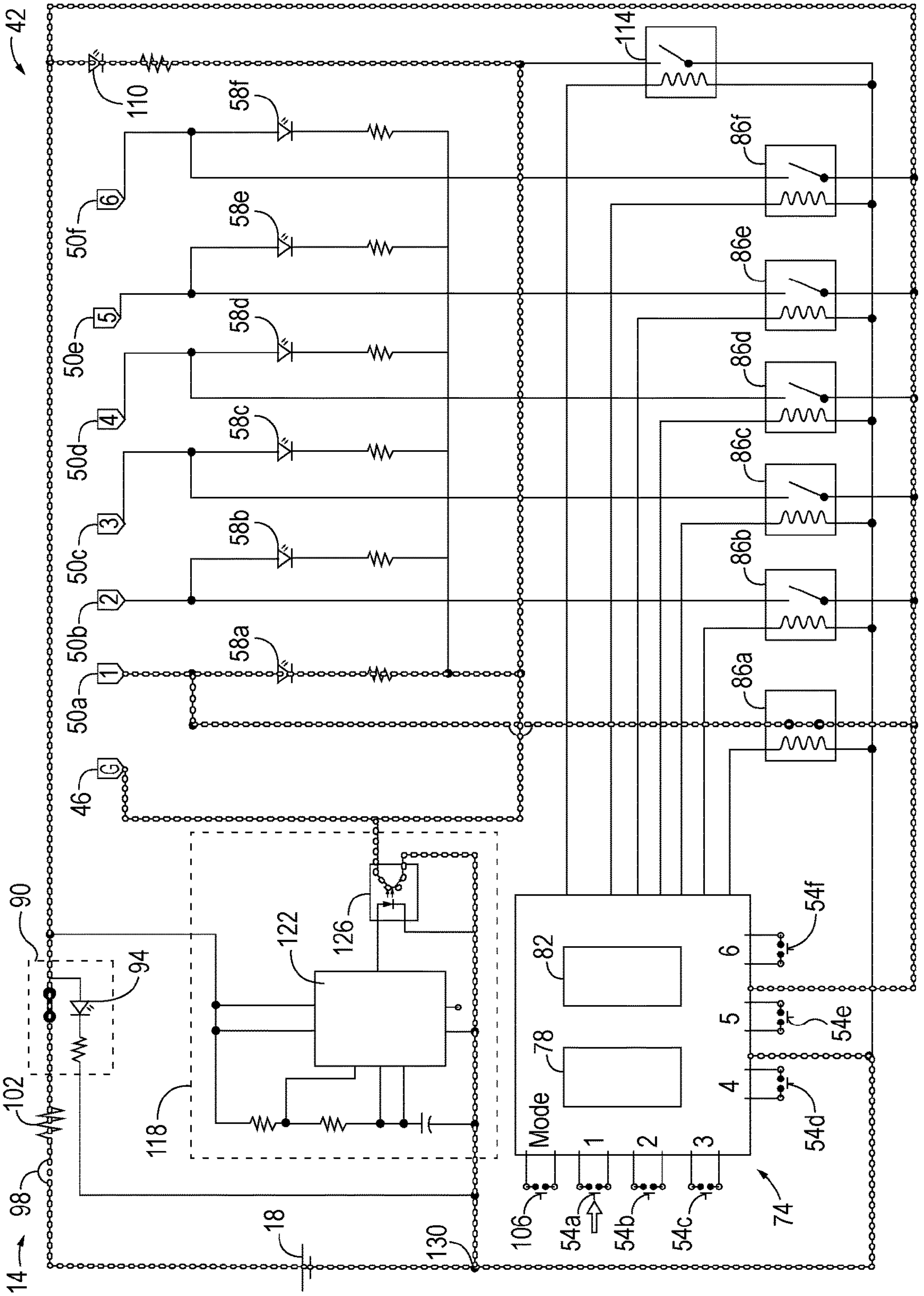
FIG. 3B is a circuit diagram of the light tester device of FIG. 1, shown in a flash mode with an output line (e.g., output line 1) energized.

With reference to FIGS. 1, 3A, and 3B, the device 14 includes an outlet connector 38 positioned on the housing 26. The outlet connector 38 includes a plurality of connection lines 42. In the illustrated embodiment, the outlet connector 38 includes the ground line 46 (e.g., a trailer ground line) and a plurality of output lines 50A-50F. In the illustrated embodiment, the plurality of connection lines 42 includes the ground line 46, a first output line 50A, and a second output line 50B, a third output line 50C, a fourth output line 50D, a fifth output line 50E, and a sixth output line 50F. In some embodiments, the outlet connector 38 includes any number of output lines. In some embodiments, the outlet connector 38 supports 4-7 pin wire harness connectors. In some embodiments, the outlet connector 38 supports a 15-pin wire harness connector, a 13-pin wire harness connector, or any number of pin wire connector. In some embodiments, the outlet connector 38 is configured to receive a plug (e.g., a trailer light wiring harness plug) with a plurality of pins. In some embodiments, the outlet connector 38 is a multi-tow 3-in-1 connector.

With continued reference to FIGS. 1, 3A, and 3B, the device 14 includes a plurality of output line switches 54A-54F positioned on the housing 26. For example, in the illustrated embodiment, a first switch 54A (corresponding to the first output line 50A) is positioned on the housing 26 and a second switch 54B (corresponding to the second output line 50B) is positioned on the housing 26. In the illustrated embodiment, for each of the output lines 50A-50F there is a corresponding output line switch 54A-54F. In some embodiments, each of the output line switches 54A-54F is a momentary switch integrated with a status LED 58A-58F. In some embodiments, the output line switches 54A-54F are normally open momentary switches. In some embodiments, the switches are momentary single-pole double throw switches (with one normally open and one normally closed contacts). In some embodiments, the LEDs 58A-58F light up to provide a visual indication of the corresponding output line energization status.

Figure 2:
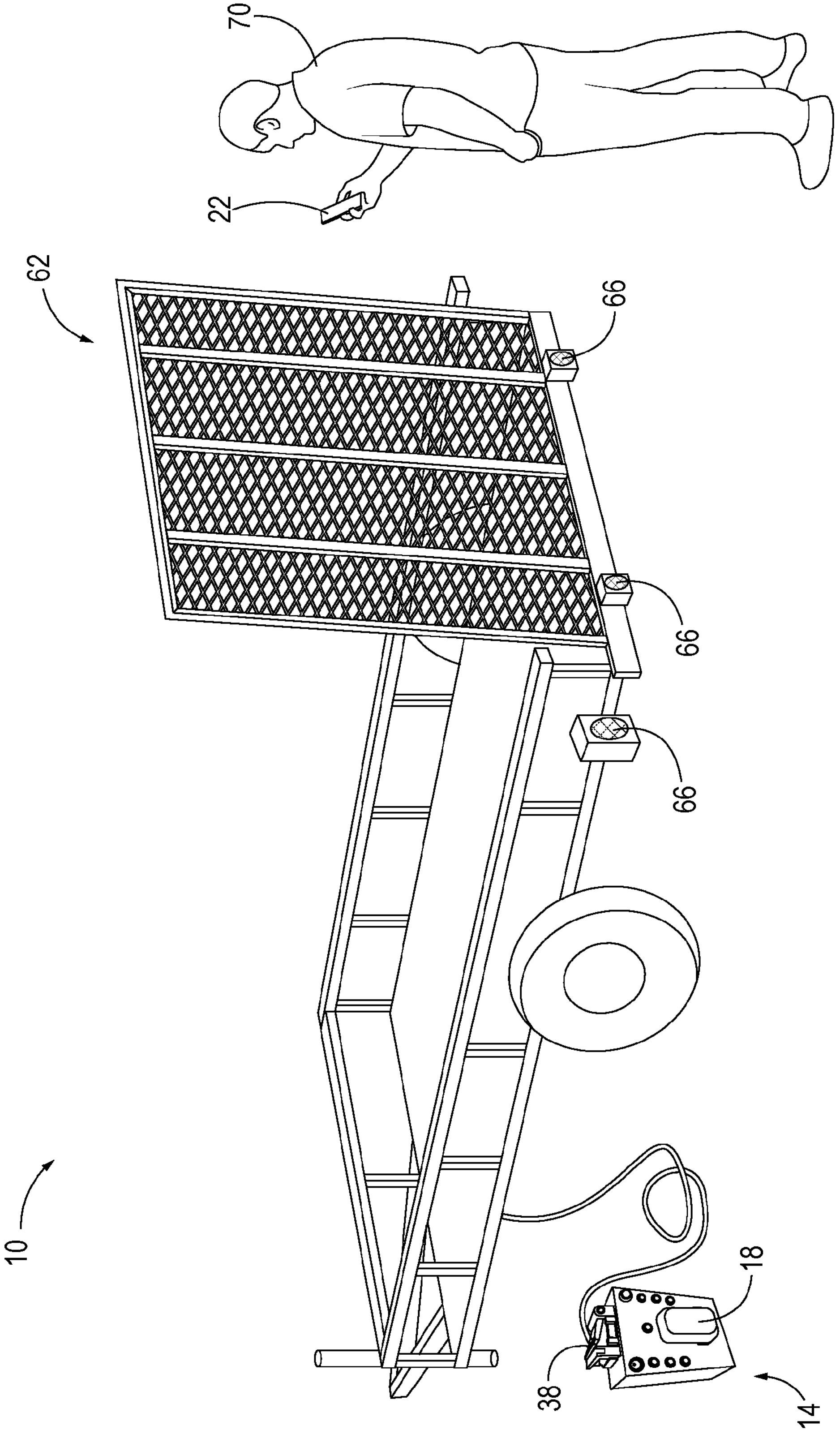
FIG. 2 is a perspective view of the system of FIG. 1 shown with a trailer including lights that are individually tested.

With reference to FIG. 2, the device 14 is shown electrically coupled to a powered object 62 (e.g., a trailer) with lights 66. As detailed herein, in other embodiments, the powered object 62 is a light assembly, a hazard marker, a sign (e.g., a lighted or mechanical sign), or other similar device with lights or accessories. In some embodiments, the powered object 62 does not include lights but other powered electrical devices (e.g., air brakes, horn, actuators, etc.). In the illustrated embodiment, the device 14 is portable and hand-held. As detailed further herein, the device 14 permits a single operator 70 to independently test each of the individual lights 66 of the powered object 62. For example, the powered object 62 includes a first light 66 electrically coupled to the first output line 50A and the ground line 46. Likewise, the powered object 62 includes a second light 66 electrically coupled to the second output line 50B and the ground line 46. Advantageously, with the system 10, no host vehicle is required to power and test the lights 66 of the trailer 62.

Advantageously, the device 14 provides the operator 70 with individual access (via separate switches) to all trailer signals at the same time, providing the operator 70 with improved diagnostic capabilities. Conventional products require operators to select one line at a time for testing. For example, six switches provide 63 different trailer control combinations, and with a flash mode option, the combination total is 127. Adding and deleting signals is advantageous when isolating intermittent shorts. As such, the device 14 provides improved control and troubleshooting capabilities. For example, to simulate a turn signal with a taillight and brakes on, the operator would have the ability to turn taillights and brakes on and pulse the turn signal for the selected line. Conventional light testers do not have this discreet level of control to perform this level of troubleshooting.

With continued reference to FIGS. 3A and 3B, the device 14 further includes a controller 74 including a wireless communication module 78 configured to receive a wireless signal. In some embodiments, the wireless communication module 78 is a Bluetooth communication module configured to receive a Bluetooth signal. In some embodiments, the controller 74 further includes a processor 82. In the illustrated embodiment, the user device 22 is in wireless communication with the wireless communication module 78. In other words, user input from the user device 22 is transmitted as commands to the wireless communication module 78. As detailed herein, the output lines 50A-50F are individually energized in response to user input on either one of the plurality of switches 54A-54F or on the user device 22. In some embodiments, each output line switch 54A-54F includes two wire connections to the controller 74 and two wires to connect to the corresponding output line to indicate the energized condition of the output line. In some embodiments, the ground for the LED 58A-58F in the switch 54A-54F is the ground line 46.

With continued reference to FIGS. 3A and 3B, the device 14 includes a plurality of output line relays 86A-86F. For example, the device 14 includes a first relay 86A electrically coupled to the first output line 50A and the controller 74. Similarly, the device 14 includes a second relay 86B electrically coupled to the second output line 50B and the controller 74. In the illustrated embodiment, the plurality of output line relays include the first relay 86A, the second relay 86B, a third relay 86C, a fourth relay 86D, a fifth relay 86E, and a sixth relay 86F.

As detailed further herein, the first output line 50A is selectively energized (e.g., turned-on) in response to actuation of the first switch 54A or in response to receiving a wireless signal from the user device 22. The first output line 50A is selectively energized by closing the first relay 86A. In the illustrated embodiment, closing the first relay 86A is performed by the controller 74 in response to actuation of the first switch 54A or in response to receiving a wireless signal from the user device 22. Similarly, the second output line 50B is selectively energized (e.g., turned-on) in response to actuation of the second switch 54B or in response to receiving a wireless signal from the user device 22. The second output line 50B is selectively energized by closing the second relay 86B. In the illustrated embodiment, closing the second relay 86B is performed by the controller 74 in response to actuation of the second switch 54B or in response to receiving a wireless signal from the user device 22. Advantageously, the operator can independently power and control each of the individual output line 50A-50F in many different configurations.

With reference to FIG. 2, the user device 22 can be a remote control, a cell phone, a tablet, a computer, hardware to support a WiFi connection, or other similar device. In the illustrated embodiment, the user device 22 is a cell phone executing an application to send a wireless signal to the wireless communication module 78 of the device. In some embodiment, the user device 22 is a cell phone utilizing Bluetooth wireless communication. As such, the operator can control the output lines 50A-50F by either interacting with the manual switches 54A-54F on the device 14 or by sending wireless signals with the user device 22. The operator can use a combination of these controls at the same time (e.g., energize first output line 50A by sending a wireless signal with the user device 22 and then use the manual switches 54A to turn off the power to the first output line 50A). This provides flexibility for the operator. For example, control from the user device 22 gives the operator the same discrete control of all the output lines but now the operator can be positioned in any location relative to the powered object 62. For example, the operator can be located under the powered object or behind the powered object during testing and operation.

With continued reference to FIGS. 1, 3A, and 3B, the device 14 further includes a power switch 90 positioned on the housing 26 and electrically coupled to the controller 74. In some embodiments, the power switch 90 is a single-pole single-throw three-pin switch with a status LED 94. The device 14 further includes a resettable circuit breaker 98. In the illustrated embodiment, the device 102 further includes a current sensor 102 (e.g., a shunt resistor) to detect the amount of current draw. In some embodiments, the current sensor 102 is connected to an outside tool (e.g., a multimeter). In some embodiments, the current sensor 102 is connected to a separate dedicated wireless communication module. In some embodiments, the current sensor 102 is connected to the controller 74 or the processor 82, more specifically.

With continued reference to FIGS. 1, 3A, and 3B, the device 14 further includes a mode switch 106 positioned on the housing 26. As detailed further herein, the mode switch 106 is actuated by a user to selectively place the device 14 in different operating modes (e.g., a steady mode, a flash mode, etc.). For example, in a steady mode (e.g., a steady-on mode) the output signals at the output lines 50A-50F are continuously on or continuously off. Alternatively, in a flash mode (e.g., an on-flashing mode), the output signals at the output lines 50A-50F are intermittently on (e.g., flashing) or continuously off. In the illustrated embodiment, the device 14 can test the continuous-on or flashing-on state of each of the six output lines 54A-54F independently. In some embodiments, a separate optocoupler is coupled to each line, which would allow one (or more) line(s) to flash and the other lines to be steady.

In some embodiments, the mode switch 106 is a momentary switch with a status LED 110. In the illustrated embodiment, the mode switch 106 further includes a mode relay 114 electrically coupled to the ground line 46 and the controller 74. The mode switch 106 selectively places the device 14 in a steady mode (FIG. 3A) by closing the mode relay 114. Closing the mode relay 114 is performed by the controller 74 is in response to actuation of the mode switch 106 or in response to receiving a wireless signal from the user device 22. Similarly, the mode switch 106 selectively places the device 14 in a flash mode (FIG. 3B) by opening the mode relay 114. Opening the mode relay 114 is performed by the controller 74 in response to actuation of the mode switch 106 or in response to receiving a wireless signal from the user device 22.

With reference to FIGS. 3A and 3B, the device 14 further includes a flash circuit 118 including a timer 122 (e.g., a 555 timer) and an optocoupler 126. In the illustrated embodiment, the optocoupler 126 is electrically coupled to the ground line 46 and electrically coupled to the timer 122. The flash circuit 118 operates at a frequency. In other words, the optocoupler 126 electrically couples the ground line 46 to a power ground 130 (e.g., a battery ground line) at a frequency determined by the timer 122. In some embodiment, the frequency is adjustable by a user. In the illustrated embodiment, the flash circuit 118 is a solid-state design. The energized output lines flash with no relay action or flash device used to pulse the signal.

With reference to FIG. 3A, the device 14 is shown in a steady mode with the power switch 90 closed, the first relay 86A closed, the mode relay 114 closed, and the first output line 50A energized. Specifically, the ground line 46 is electrically connected to the power ground 130 through the mode relay 114. In some embodiments, upon power-up the mode switch is in the position shown in FIG. 3A (e.g., not energized and not flashing).

With reference to FIG. 3B, the device 14 is shown in a flash mode with the power switch 90 closed, the first relay 86A closed, the mode relay 114 open, and the first output line 50A energized at a frequency. Specifically, the ground line 46 is intermittently electrically connected to the power ground 130 through the optocoupler 126.

In some embodiments, the user device 22 wireless sends an automated sequence of wireless signals (e.g., a script of commands) to the wireless communication module 78 in response to user input on the user device 22. In other words, the user device 22 provides the ability to control on/off of output lines in real-time or the ability to an automated sequence of commands that result in different light sequences. As one example, the automated sequence cycles through all the output lines by turning on an output line individually for 5 seconds and then turning off the output line off before turning on the next output line. In some embodiments, the user device executes an application with a user interface that allows an operator to name the output lines.

With reference to FIG. 1, the housing 26 includes a first surface 134 and the battery pack interface 30, the mode switch 106, and the plurality of output line switches 54A-54F are positioned on the first surface 134. The housing 26 further includes a second surface 138 and the outlet connector 38 is positioned on the second surface 138. In the illustrated embodiment, the second surface 138 is oriented 90 degrees with respect to the first surface 134.

Figure 4:
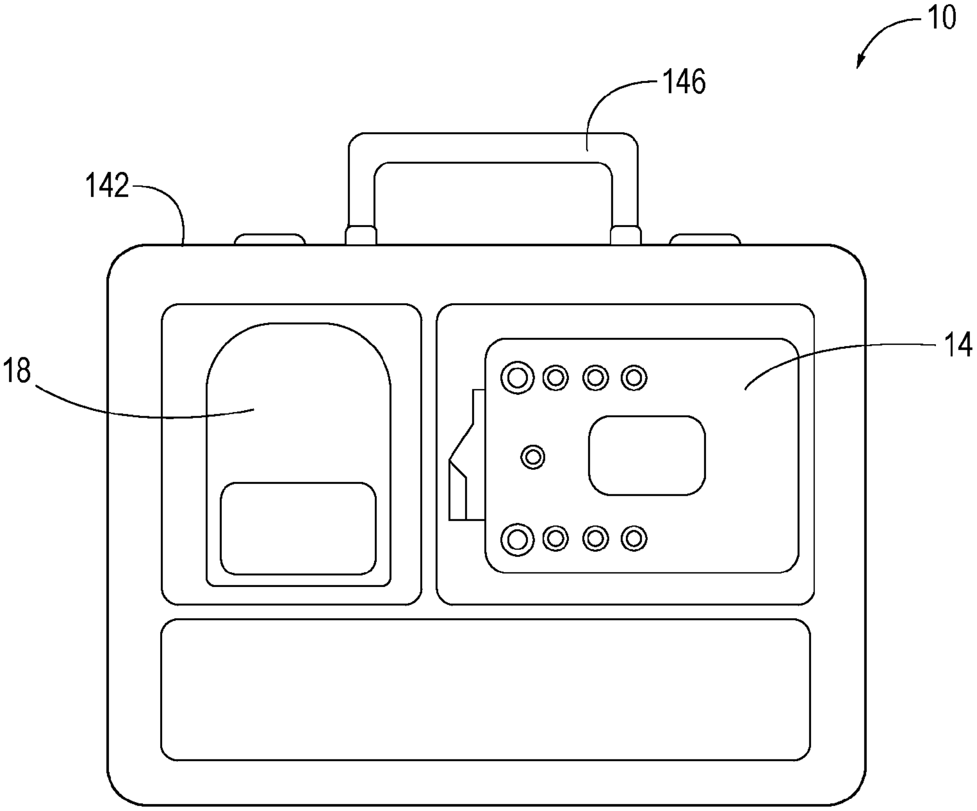
FIG. 4 is a side view of the system of FIG. 1 further including a carrying case.

With reference to FIG. 4, the system 10 further includes a case 142 (e.g., a carrying case, a tool box) with a handle 146. The device 14 and the battery pack 18 are positioned within the case 142, for example, during storage or transport. In some embodiments, the device 14 includes a handle. In other embodiments, the housing 26 of the device 14 can temporarily attach to a temporary host vehicle (i.e., a vehicle that is not otherwise capable of connecting to or controlling trailer lights) or the frame of a trailer for a self-contained host light controller and power source applications.

In some embodiments, the device 14 and system 10 are utilized to selectively energize and control various types of powered objects. In some embodiments, the device 14 powers and controls a DC powered device. In some embodiments, the system 10 includes a power converter (DC to AC power inverter) and the device 14 powers and controls an AC powered device. In some embodiments, the device 14 can be used to power and control trailers attached to vehicles that cannot power and control trailer lights. In some embodiments, the device 14 can power and control other accessories and lighting devices.

For example, many temporary vehicles (e.g., skid loaders, forklifts, telehandlers, lawn tractors, utility vehicles, old tractors, etc.) that are often used to transport trailers in off-road environments (e.g., constructions sites, farms, distribution centers, marinas, warehouses, equipment yards, storage facilities, etc.) do not have the ability to connect to or control trailer lights. In some embodiments, the device 14 and system 10 are attached to these temporary vehicles and used as a portable host light controller and power source (e.g., a compact self-contained light system) that provides and operate flashing trailer lights to enhance visibility and safety in these off-road environments. The self-contained, portable host light controller and power source application of the device can also be used to enable flashing lights on a broken down trailer, for example, parked at the side of a road or used to power additional flashing light bars when transporting oversized equipment between work sites.

Advantageously, the device 14 disclosed herein provides the unique ability to control each output line independently and simultaneously combined with either manual switches or a wireless signal. As such, the device 14 is able to energize multiple lines at once and in any combination. In addition, a Bluetooth application, for example, on the user device can send wireless signals including various sets of commands to the unit (i.e., this could be programed to run an automatic cycle test, or have custom interfaces to drive custom light bars, such as a portable stop light, a light tree for drag racing, triangle hazard signs, etc.). As such, the device and system disclosed herein have multiple uses. For example, the ability to use the device as a full function trailer light tester, but also use the device to power special purpose light bars (e.g., leveraging the use of standard trailer connectors). The device can also light up and flash a broken-down trailer left at the side of a highway, a light powered sign, a public safety sign, an advertisement, an entertainment sign, an outdoor venue exit sign, etc.

Various features and advantages are set forth in the following claims.

What is claimed is:

1. A device comprising:
- a housing;
- a first switch positioned on the housing;
- a second switch positioned on the housing;
- a battery pack interface positioned on the housing;
- an outlet connector positioned on the housing, wherein the outlet connector includes a ground line, a first output line, and a second output line;
- a flash circuit including a timer and an optocoupler; the optocoupler having an input side and an output side that are optically coupled and electrically isolated from one another; the optocoupler electrically coupled to the ground line at a frequency determined by the timer;
- a mode switch that selectively places the device in a steady mode or a flash mode;
- a controller including a wireless communication module configured to receive a wireless signal;
- a first relay electrically coupled to the first output line and the controller; and
- a second relay, separate and independent from the first relay, electrically coupled to the second output line and the controller;
- wherein the first output line is selectively energized independently of the second output line in response to actuation of the first switch or in response to receiving the wireless signal; and
- wherein the second output line is selectively energized independently of the first output line in response to actuation of the second switch or in response to receiving the wireless signal.

2. The device of claim 1, wherein the first output line is selectively energized by closing the first relay, and wherein closing the first relay is in response to actuation of the first switch or in response to receiving the wireless signal; and wherein the second output line is selectively energized by closing the second relay, and wherein closing the second relay is in response to actuation of the second switch or in response to receiving the wireless signal.

3. The device of claim 1, further comprising a power switch positioned on the housing and electrically coupled to the controller.

4. The device of claim 1, wherein the mode switch is positioned on the housing.

5. The device of claim 4, wherein the mode switch includes a mode relay electrically coupled to the ground line and the controller.

6. The device of claim 5, wherein the mode switch selectively places the device in the steady mode by closing the mode relay.

7. The device of claim 6, wherein closing the mode relay is in response to actuation of the mode switch or in response to receiving the wireless signal.

8. The device of claim 1, wherein the frequency is adjustable by a user.

9. The device of claim 1, further comprising a resettable circuit breaker and a current sensor configured to test an individual output line or any combination of output lines together.

10. The device of claim 1, wherein the housing includes a first surface, and wherein the battery pack interface, the mode switch, the first switch, and the second switch are positioned on the first surface; and wherein the housing includes a second surface, and wherein the outlet connector is positioned on the second surface.

11. The device of claim 1, wherein the device is handheld.

12. The device of claim 1, wherein the optocoupler comprises a light-emitting diode optically coupled to a photo-sensitive transistor.

13. The device of claim 1, further comprising a status light-emitting diode associated with each of the first output line and the second output line, each status light-emitting diode configured to illuminate to indicate an energized condition of a corresponding output line.

14. The device of claim 13, further comprising a resettable circuit breaker and a current sensor configured to test an individual output line or any combination of output lines together.

15. A system comprising:

a device including a battery pack interface, an outlet connector with a ground line, a first output line, and a second output line, a plurality of switches, a flash circuit including a timer and an optocoupler having an input side and an output side that are optically coupled and electrically isolated from one another; the optocoupler electrically coupled to the ground line at a frequency determined by the timer, a first relay electrically coupled to the first output line, a second relay separate and independent from the first relay and electrically coupled to the second output line, and a controller with a wireless communication module;

a battery pack removably coupled to the battery pack interface;

a user device in wireless communication with the wireless communication module;

wherein the first output line and the second output line are individually and independently energized in response to user input on either one of the plurality of switches or on the user device.

16. The system of claim 15, further comprising a case with a handle; and wherein the device and the battery pack are positioned within the case.

17. The system of claim 15, wherein the user device is a remote control, a cell phone, a tablet, or a computer.

18. The system of claim 15, further comprising a powered object with a first light and a second light, wherein the first light is electrically coupled to the first output line and the ground line, and wherein the second light is electrically coupled to the second output line and the ground line.

19. The system of claim 18, wherein the powered object is a trailer, a light assembly, a hazard marker, a lighted sign, a mechanical sign, or accessory.

20. The system of claim 15, wherein the user device wirelessly sends an automated sequence of wireless signals to the wireless communication module in response to user input on the user device.

* * * * *